(12) United States Patent
Sugio et al.

(10) Patent No.: US 8,421,136 B2
(45) Date of Patent: Apr. 16, 2013

(54) SEMICONDUCTOR DEVICE AND FABRICATION PROCESS THEREOF

(75) Inventors: Kenichirou Sugio, Miyazaki (JP); Kenichirou Tanaka, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 687 days.

(21) Appl. No.: 12/511,253

(22) Filed: Jul. 29, 2009

(65) Prior Publication Data

US 2010/0038739 A1     Feb. 18, 2010

(30) Foreign Application Priority Data

Aug. 18, 2008 (JP) ................................ 2008-209661

(51) Int. Cl.
  *H01L 27/146* (2006.01)
(52) U.S. Cl.
  USPC .................... 257/294; 257/435; 257/E31.122
(58) Field of Classification Search ............... 257/294, 257/435, E31.122, E29.282
  See application file for complete search history.

(56) References Cited

U.S. PATENT DOCUMENTS

| | | | | |
|---|---|---|---|---|
| 6,653,617 B2* | 11/2003 | Hiyama et al. | ................ | 257/435 |
| 6,815,787 B1* | 11/2004 | Yaung et al. | ................... | 257/292 |
| 7,390,690 B2* | 6/2008 | Rhodes | ................. | 257/E31.122 |
| 7,466,002 B2* | 12/2008 | Shaffer | ................. | 257/E31.122 |
| 7,728,268 B2* | 6/2010 | Sato et al. | ................... | 250/208.1 |
| 7,791,156 B2* | 9/2010 | Chiba | ................... | 257/E31.122 |
| 2005/0087784 A1* | 4/2005 | Lee et al. | ...................... | 257/294 |
| 2009/0243016 A1* | 10/2009 | Kawahara et al. | ............ | 257/435 |

FOREIGN PATENT DOCUMENTS

JP    2006-237576    9/2006

* cited by examiner

*Primary Examiner* — Matthew Landau
*Assistant Examiner* — Sun M Kim
(74) *Attorney, Agent, or Firm* — Taft Stettinius & Hollister LLP

(57) ABSTRACT

A semiconductor device that includes a circuit portion, a first light-shielding film and plural second light-shielding films. In the circuit portion, a plurality of wiring layers that include circuit elements are laminated. The first light-shielding film covers an uppermost layer of the wiring layers and light-shields light that is illuminated at the circuit portion. The second light-shielding films are covered by the first light shielding film and formed so as to respectively encircle the wiring layers in ring forms. Outer peripheries of the plural second light-shielding films are formed to be successively smaller from an upper to a lower layer, so as to be at the inner side relative to the outer periphery of the second light-shielding film of the upper layer.

6 Claims, 9 Drawing Sheets

PARTIAL DESCRIPTIVE VIEW OF SECOND EXEMPLARY EMBODIMENT OF THE PRESENT INVENTION

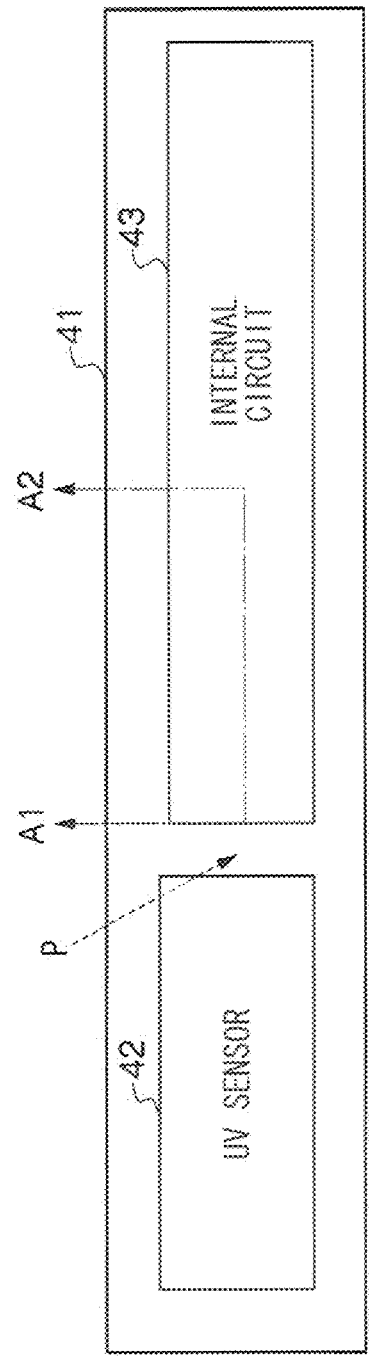

ENLARGED SECTIONAL VIEW ALONG LINE A1-A2

SCHEMATIC STRUCTURAL VIEW OF UV SENSOR CHIP OF FIRST EXEMPLARY EMBODIMENT OF THE PRESENT INVENTION

SCHEMATIC PERSPECTIVE VIEW OF METAL LAYERS IN FIG. 1B

FABRICATION STEP DIAGRAMS OF UV SENSOR CHIP
OF FIG. 1A AND FIG. 1B

PARTIAL DESCRIPTIVE VIEW OF SECOND EXEMPLARY EMBODIMENT
OF THE PRESENT INVENTION

ENLARGED VIEW OF LIGHT-SHIELDING
METAL PORTIONS OF FIG. 4A

PARTIAL SECTIONAL VIEW OF UV SENSOR CHIP
OF SECOND EXEMPLARY EMBODIMENT OF THE PRESENT INVENTION

SECTIONAL VIEW

PLAN VIEW

VIEW OF LIGHT-SHIELDING METALS AND FOURTH LAYER METAL
OF THIRD EXEMPLARY EMBODIMENT OF THE PRESENT INVENTION

SCHEMATIC STRUCTURAL VIEW OF
CONVENTIONAL UV SENSOR CHIP

SCHEMATIC PERSPECTIVE VIEW OF CIRCUIT PORTION 20 AND
LIGHT-SHIELDING FILM PORTION 30 IN FIG. 6B

SEMICONDUCTOR DEVICE AND FABRICATION PROCESS THEREOF

CROSS-REFERENCE TO RELATED APPLICATIONS

This application claims priority under 35 U.S.C. §119 from Japanese Patent Application No. 2008-209661 filed on Aug. 18, 2008, the disclosure of which is incorporated by reference herein.

RELATED ART

1. Technical Field

The present disclosure relates to a semiconductor device in which, for example, a large-scale integrated circuit (hereinafter referred to as an LSI) with a multi-layered wiring structure or the like is light-shielded with a light-shielding film, and a fabrication process thereof.

2. Related Art

In recent years, with the rise in health awareness and anti-aging awareness, demand for conducting skincare in accordance with daily received light amounts of ultraviolet radiation (hereinafter referred to as UV) has been rising. In order to ascertain received light amounts, a portable UV monitoring apparatus with a small size that is capable of easily measuring even outdoor sources has been implemented. As a component of the UV monitor apparatus, a UV sensor LSI that incorporates a UV sensor and peripheral circuitry in one chip (hereinafter referred to as a UV sensor chip) has been developed, with complementary metal oxide semiconductor technology (hereinafter referred to as CMOS). An LSI mounted on a circuit board that is subjected to the effects of such light must be light-shielded, in order to prevent characteristics of the transistors being altered by the effects of the light.

FIG. 6A and FIG. 6B are schematic structural diagrams illustrating a conventional UV sensor chip. FIG. 6A is a plan view, and FIG. 6B is an enlarged sectional view along A1-A2 of FIG. 6A.

As shown in FIG. 6A, a UV sensor chip 1 is structured with a UV sensor 2 that detects UV in light P and, provided in a vicinity thereof, an internal circuit 3 that is electrically connected to the UV sensor 2. The UV sensor 2 is a component that receives the UV from the light P, converts the same to electronic signals, and outputs the signals to the internal circuit 3. The internal circuit 3 is a circuit that is structured with, for example, an output circuit of an amplifier and the like, amplifies the electronic signals outputted from the UV sensor 2 and outputs the same to the exterior.

As shown in FIG. 6B, the UV sensor chip 1 has a multi-layered wiring structure (as an example, a four-layer structure) and includes a substrate 10. The UV sensor 2, which is not illustrated, and the internal circuit 3 are formed on the substrate 10. The internal circuit 3 is constituted with a circuit portion 20 and a light-shielding film portion 30 that light-shields the circuit portion 20.

A first layer of the circuit portion 20 includes circuit elements 21-1, such as transistors, resistors, capacitors and the like, which are covered by an interlayer insulation film 11-1. The circuit elements 21-1 are connected by a metal wiring layer 22-1. A second layer includes an interlayer insulation film 11-2 laminated on the metal wiring layer 22-1 and a metal wiring layer 22-2 that is formed over the interlayer insulation film 11-2. A third layer includes circuit elements 21-2 that are covered by an interlayer insulation film 11-3. The circuit elements 21-2 are electrically connected by a metal wiring layer 22-3. In a fourth layer, an interlayer insulation film 11-4 is laminated.

The light-shielding film portion 30 includes a fourth layer metal 33 at an uppermost layer portion and three layers of light-shielding metal 31-1 to 31-3, which correspond with the layers of the circuit portion 20. The light-shielding metals 31-1 to 31-3 encircle the metal wiring layers 22-1 to 22-3, respectively, of the circuit portion 20 in ring forms. That is, the first layer of the light-shielding film portion 30 includes the interlayer insulation film 11-1 and the light-shielding metal 31-1 that is formed thereover. The light-shielding metal 31-1 encircles the metal wiring layer 22-1 in a ring form. The second layer includes the interlayer insulation film 11-2 and the light-shielding metal 31-2 that is formed thereover. The light-shielding metal 31-2 encircles the metal wiring layer 22-2 in a ring form. The third layer includes the interlayer insulation film 11-3 and the light-shielding metal 31-3 that is formed thereover. The light-shielding metal 31-3 encircles the metal wiring layer 22-3 in a ring form.

The fourth layer includes the interlayer insulation film 11-4 and the fourth layer metal 33 formed thereover. The fourth layer metal 33 is formed as a metal layer over the whole area, and covers the circuit portion 20 and the light-shielding film portion 30. The fourth layer metal 33 and the light-shielding metals 31-1 to 31-3 are electrically connected by a via plug 32 that penetrates therethrough in the vertical direction. A passivation layer 13 is formed on a top face of the fourth layer metal 33, to prevent deterioration due to the effects of humidity and the like from the external environment and to stabilize the surface of the UV sensor chip 1.

FIG. 7 is a schematic perspective view showing the circuit portion 20 and light-shielding portion 30 of FIG. 6B. Shapes of the metal wiring layers 22-1 to 22-3 are rectangular thin films, and sizes thereof are the same. The metal wiring layers 22-1 to 22-3 are encircled by the light-shielding metals 31-1 to 31-3 in ring forms. A width of the light-shielding metal at each layer is of the order of 10 μm.

In the UV sensor chip 1 with this structure, UV in light P is received at the UV sensor 2, converted to electronic signals and outputted to the internal circuit 3. At the internal circuit 3, this output is amplified and outputted to the exterior.

Previous technical literature relating to light-shielding layouts of light sensors such as UV sensor chips, CMOS image sensors and the like includes, for example, Japanese Patent Application Laid-Open (JP-A) No. 2006-237576.

In JP-A No. 2006-237576, a technology relating to a light-shielding layout of a CMOS image sensor is described. The CMOS image sensor is constituted with an array of CMOS imaging elements. Each CMOS imaging element includes a transistor, a capacitor and a light-sensitive element (for example, a photodiode). Apertures are formed to cover over the light-sensitive elements, and expose the light detection elements while shielding light from reaching circuitry other than the light detection elements. In such a case, unwanted currents may be generated in the circuitry by light that is incident at inclined angles with respect to the apertures, causing crosstalk, and the performance of the CMOS image sensor may be adversely affected. In order to prevent this, a light-shielding belt formed of an electrically conductive material is formed in the shape of a wall passing through one or plural inter-metal dielectric layers.

In the conventional technology, as shown in FIG. 6B and FIG. 7, the light-shielding film portion 30 is provided in order to prevent ingression of unwanted light into the circuit portion 20. However, if light P is incident on the UV sensor chip 1 from an inclined direction, the light is reflected between the light-shielding metal layers 31-1 to 31-3, the light reaches the interior of the circuit portion 20, and characteristics of transistors and the like are altered by the effects of this light, which is a problem.

Accordingly, in order to solve the problem described above, utilization of the wall-form light-shielding belt recited in JP-A number 2006-237576 has been considered. However, the wall-form light-shielding belt cannot be provided at portions at which wiring leads out in order to attain electrical connection between the internal circuit and the sensor portion, so complete light-shielding is not possible.

INTRODUCTION TO THE INVENTION

The present disclosure has been made in view of the above circumstances and provides a semiconductor device and a semiconductor fabrication process.

The present disclosure provides a semiconductor device including: a circuit portion in which a plurality of wiring layers that include circuit elements are laminated; a first light-shielding film that covers an uppermost layer of the wiring layers and light-shields light that is illuminated at the circuit portion; and a plurality of second light-shielding films that are covered by the first light-shielding film and formed so as to respectively encircle the wiring layers in ring forms, wherein outer peripheries of the plurality of second light-shielding films are formed to be successively smaller from an upper layer to a lower layer, so that an outer periphery of each second light-shielding film is at an inner side relative to an outer periphery of a second light-shielding film disposed at an upper layer side thereof.

The present disclosure provides a semiconductor device fabrication process including: a first step of forming a first wiring layer on a substrate and forming a first light-shielding film that encircles the first wiring layer in a ring form on the substrate; a second step of laminating one or a plurality of a second wiring layer over the first wiring layer with an insulation layer therebetween, and laminating one or a plurality of a second light-shielding film over the first wiring layer such that the second light-shielding film encircles the second wiring layer in a ring form and an outer periphery thereof is disposed at an outer side relative to an outer periphery of the first light-shielding film; and a third step of forming a third light-shielding film over an uppermost layer of the second wiring layer and an uppermost layer of the second light-shielding film, with an insulation layer therebetween, such that an outer periphery of the third light-shielding film is disposed at an outer side relative to the outer periphery of the uppermost layer of the second light-shielding film.

According to the present disclosure, there are the following effects (1) and (2).

(1) The outer peripheries of the second light-shielding films of the respective layers are formed to be successively smaller to the inner side from the upper layer to the lower layer. Therefore, even if, for example, light is incident from diagonally above the semiconductor device, the light will not be reflected by the second light-shielding films of the layers. Therefore, incidences of light reaching the interior of the circuit portion due to being reflected between the second light-shielding films may be prevented.

(2) New members, devices and the like for light-shielding are not required. Therefore, an increase in an area of formation in the semiconductor device may be suppressed and miniaturization is enabled.

BRIEF DESCRIPTION OF THE DRAWINGS

Exemplary embodiments of the present disclosure will be described in detail based on the following figures, wherein:

FIG. 1A and FIG. 1B are schematic structural diagrams illustrating a semiconductor device (as an example, a UV sensor chip) of a first exemplary embodiment of the present disclosure.

DETAILED DESCRIPTION

The exemplary embodiments of the present disclosure are described and illustrated below to encompass semiconductor devices and methods of manufacturing the same. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present disclosure. It should be noted that the drawings are solely for description and are not to limit the technical scope of the present invention.

Structure of First Exemplary Embodiment

Figure 1B:
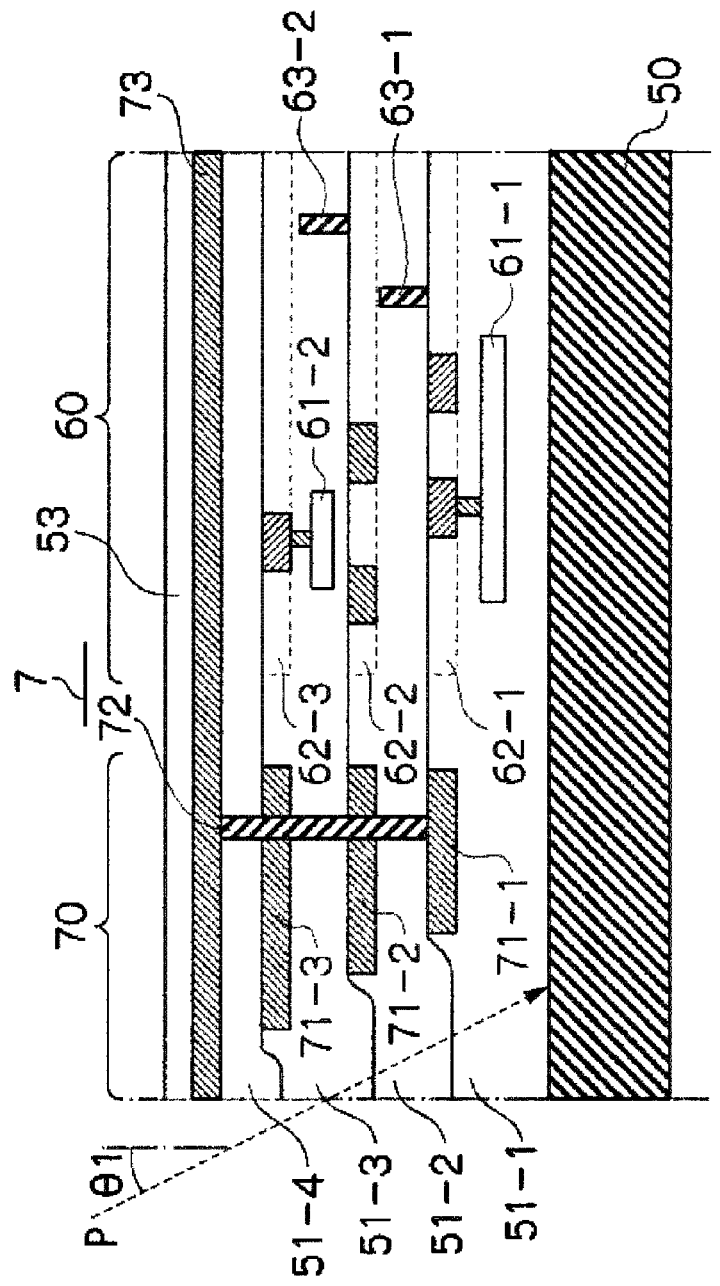

FIG. 1A and FIG. 1B are schematic structural diagrams illustrating a semiconductor device (as an example, a UV sensor chip) of a first exemplary embodiment of the present disclosure. FIG. 1A is an overall plan view, and FIG. 1B is a sectional enlarged view along line A1-A2 of FIG. 1A.

As illustrated in FIG. 1A, a UV sensor chip 41 is structured with a sensor portion 42 that detects UV in light P (for example, a UV sensor), and an internal circuit 43 that is disposed in a vicinity of the UV sensor 42 and is electrically connected to the UV sensor 42.

As illustrated in FIG. 1B, the UV sensor chip 41 has a multi-layered wiring structure (as an example, a four-layer structure) and includes a substrate 50. The UV sensor 42 and internal circuit 43 illustrated in FIG. 1A are formed on the substrate 50. The internal circuit 43 is structured with the circuit portion 60 and the light-shielding portion (for example, a light-shielding film portion) 70, which light-shields the circuit portion 60.

The circuit portion 60 is structured by a first layer to a fourth layer. The first layer includes circuit elements 61-1, such as transistors, resistors, capacitors and the like, which are covered by an interlayer insulation film 51-1 (for example, an interlayer insulation film). The circuit elements 61-1 are connected up by a metal wiring layer 62-1. The second layer includes an interlayer insulation film 51-2 laminated on the metal wiring layer 62-1 and a metal wiring layer 62-2 that is formed over the interlayer insulation film 51-2. The third layer includes circuit elements 61-2 that are covered by an interlayer insulation film 51-3. The circuit elements 61-2 are connected up by a metal wiring layer 62-3. In the fourth layer, an interlayer insulation film 51-4 is laminated. Over the fourth layer, a fourth layer metal 73 is formed as a metal layer over the whole area, and covers the circuit portion 60, the light-shielding portion 70 and the like. The metal wiring layers 62-1 and 62-2 are electrically connected by a via plug 63-1, and the metal wiring layers 62-2 and 62-3 are electrically connected by a via plug 63-2.

The light-shielding film portion 70 includes the fourth layer metal 73 and three layers of light-shielding metal 71-1 to 71-3, which correspond with the layers of the circuit portion 60. The light-shielding metals 71-1 to 71-3 encircle the metal wiring layers 62-1 to 62-3, respectively, of the circuit portion 60 in ring forms. That is, the first layer of the light-shielding film portion 70 includes the interlayer insulation film 51-1 and the light-shielding metal 71-1 that is formed over the interlayer insulation film 51-1. The light-shielding metal 71-1 encircles the metal wiring layer 62-1 in a ring form. The second layer includes the interlayer insulation film 51-2 and the light-shielding metal 71-2 that is formed over the interlayer insulation film 51-2. The light-shielding metal 71-2 encircles the metal wiring layer 62-2 in a ring form. The third layer includes the interlayer insulation film 51-3 and the light-shielding metal 71-3 that is formed over the interlayer insulation film 51-3. The light-shielding metal 71-3 encircles the metal wiring layer 62-3 in a ring form.

The fourth layer metal 73 and the light-shielding metals 71-1 to 71-3 are electrically connected by a via plug 72 that penetrates therethrough in the vertical direction. A passivation layer 53 is formed at the top face of the fourth layer metal 73, to prevent deterioration due to the effects of humidity and the like from the external environment and to stabilize the surface of the semiconductor device.

Figure 2:
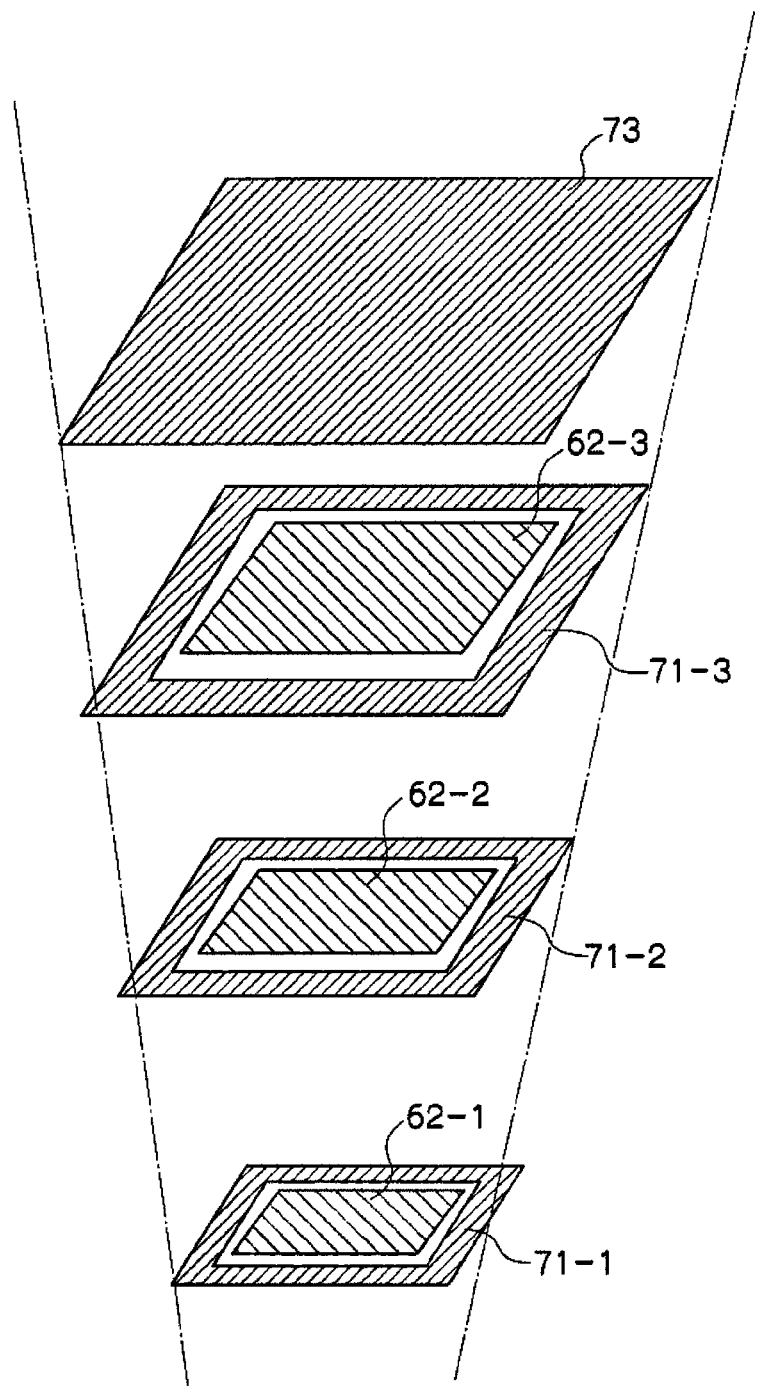
FIG. 2 is a schematic perspective view illustrating a circuit portion 60 and a light-shielding portion 70 in FIG. 1B.

FIG. 2 is a schematic perspective view illustrating the circuit portion 60 and light-shielding portion 70 of FIG. 1B. Shapes of the metal wiring layers 62-1 to 62-3 are rectangular thin films, and are encircled by the light-shielding metals 71-1 to 71-3 in ring forms. Breadths of the light-shielding metals 71-1 to 71-3 at the respective layers get narrower from the upper layer to the lower layer. For example, breadth of the light-shielding metal 71-1 is around 6 μm, breadth of the light-shielding metal 71-2 is around 7 μm and breadth of the light-shielding metal 71-3 is around 8 μm.

Next, operations of the UV sensor chip 41 of the first exemplary embodiment will be described.

The UV sensor 42 in the UV sensor chip 41 receives UV from the light P, converts the UV to electronic signals and outputs the electronic signals to the internal circuit 43. In the internal circuit 43, the electronic signals are amplified by an amplifier or the like and outputted to the exterior. Now, because the UV sensor chip 41 will commonly be used outdoors, the UV sensor chip 41 will be exposed to outdoor light, and outdoor light, the light P, will be incident even from side faces of the internal circuit 43. However, the periphery of the circuit portion 60 is encircled by the light-shielding film portion 70, and outer peripheries of the light-shielding metals 71-1 to 71-3 are formed to be successively smaller to the inner side from the upper layer to the lower layer. Therefore, even when, for example, the light P is incident from diagonally above the UV sensor chip 41, the light P will not be reflected at the layers of the light-shielding metals 71-1 to 71-3. Therefore, the light P will not reach the circuit portion 60. Because the UV sensor 42 is disposed in the vicinity of the internal circuit 43, incidence amounts of the light P from a transverse direction of the internal circuit 43 are small. Therefore, there will be very little effect on the circuit elements 61-1 and 61-2.

Fabrication Process of the First Exemplary Embodiment

FIG. 3A to FIG. 3E are fabrication step diagrams illustrating a fabrication process of the UV sensor chip of FIG. 1B.

The UV sensor chip 41 of the first exemplary embodiment is fabricated by, for example, the following steps (1) to (6).

Figure 3A:
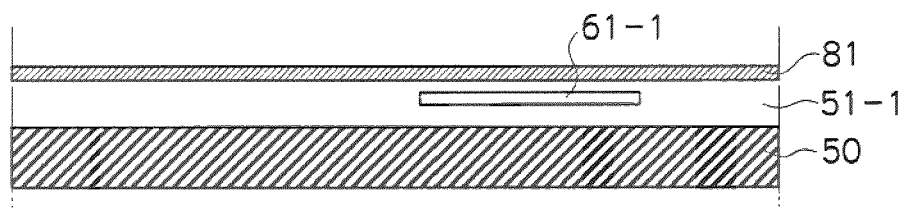
FIG. 3A to FIG. 3E are fabrication step diagrams illustrating a fabrication process of the UV sensor chip of FIG. 1B.

(1) First Layer Metal Formation Step of FIG. 3A

By a thermal oxidation method or the like, the substrate 50, which is a silicon substrate or the like, is reacted with oxygen or water vapor and the surface thereof is oxidized, growing an insulating film. Then, the circuit elements 61-1 such as transistors, resistors, capacitors and the like are formed on the substrate 50, with the interlayer insulation film 51-1, which is a silicon oxide film or the like, therebetween. By a chemical vapor deposition method ("CVD method" hereinafter) or the like, the circuit elements 61-1 are covered with the interlayer insulation film 51-1, and the surface is made flat. Contact holes are opened up in the interlayer insulation film 51-1 over the circuit elements 61-1 that are to be connected up, by a lithography technique and an etching technique. Then, a metal film of aluminum or the like is laminated on the interlayer insulation film 51-1 by a sputtering method, and a whole-surface metal layer 81 is formed.

Figure 3B:
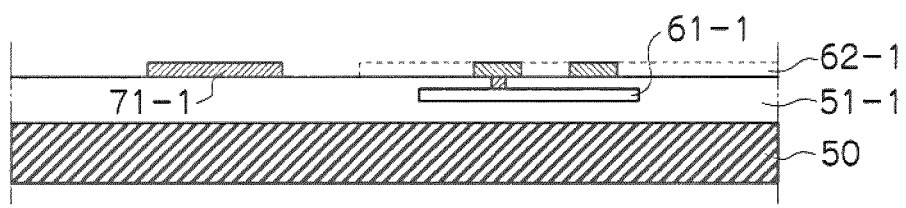

(2) First Layer Metal Etching Step of FIG. 3B

The whole-surface metal layer 81 is etched by the lithography technique and etching technique, and the metal wiring layer 62-1 and the light-shielding metal 71-1 are formed.

Figure 3C:
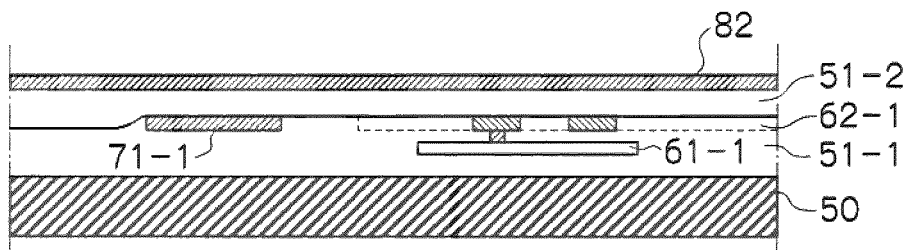

(3) Second Layer Metal Formation Step of FIG. 3C

The metal wiring layer 62-1 and light-shielding metal 71-1 are covered over with the interlayer insulation film 51-2, and the surface is made flat. A metal film is laminated on the interlayer insulation film 51-2 by a sputtering method or the like, and a whole-surface metal layer 82 is formed.

Figure 3D:
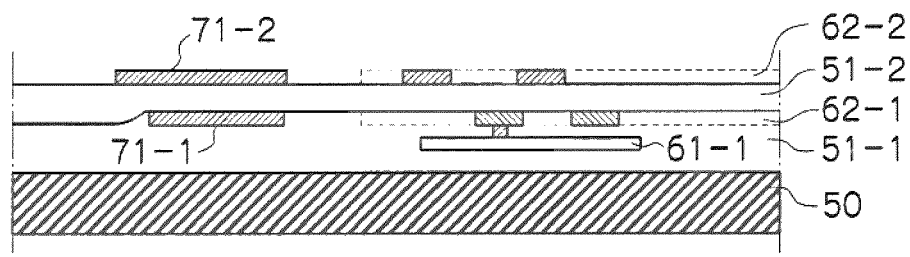

(4) Second Layer Metal Etching Step of FIG. 3D

The whole-surface metal layer 82 is etched by the lithography technique and etching technique, and the metal wiring layer 62-2 and the light-shielding metal 71-2 are formed.

Figure 3E:
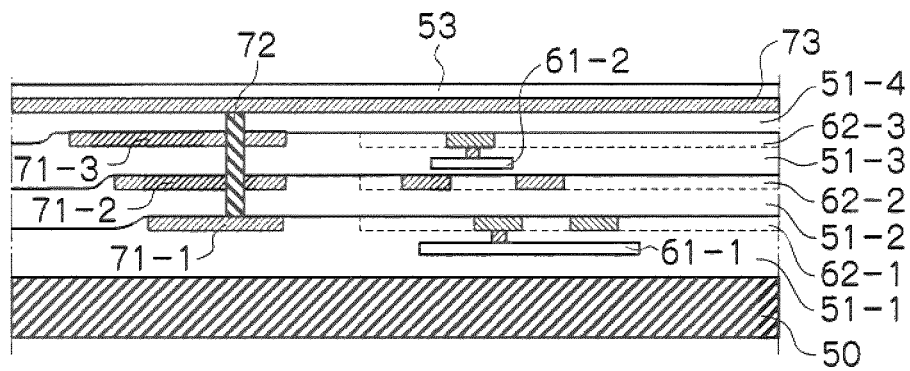

(5) Steps of Third and Fourth Layer Metal Formation and the Like of FIG. 3E

The metal wiring layer 62-2 and light-shielding metal 71-2 are covered over with the interlayer insulation film 51-3, and the surface is made flat. The circuit elements 61-2 such as transistors, resistors, capacitors and the like are formed on the interlayer insulation film 51-3. The circuit elements 61-2 are covered with the interlayer insulation film 51-3, and the surface is made flat. A metal film is laminated over the interlayer insulation film 51-3 by a sputtering method, and a whole-surface metal layer 83 is formed.

The whole-surface metal layer 83 is etched by the lithography technique and etching technique, and the metal wiring layer 62-3 and light-shielding metal 71-3 are formed. At the same time, via plug holes (via holes) are opened up in the light-shielding metals 71-1 to 71-3. The via holes are filled with metal by a metal plating method, and the via plug 72 is formed in the light-shielding metals 71-1 to 71-3.

Next, the metal wiring layer 62-3 and the light-shielding metal 71-3 are covered over with the interlayer insulation film S14, and the surface is made flat. The fourth layer metal 73 of the topmost layer is formed over the whole area, including the via plug 72. Thus, the fourth layer metal 73 and the light-shielding metals 71-1 to 71-3 are electrically connected. Finally, the passivation layer 53 and suchlike is formed over the fourth layer metal 73, of silicon oxide, engineering plastic (a polyimide resin) or the like, and thus fabrication of the UV sensor chip 41 of FIG. 1B is complete.

(6) UV Sensor Fabrication Step

The UV sensor 42 may be suitably formed on the substrate 50 in the above-described fabrication steps (1) to (5).

Effects of the First Exemplary Embodiment

According to the present exemplary embodiment, there are the following effects (1) to (3).

(1) The outer peripheries of the light-shielding metals 71-1 to 71-3 are formed to be successively smaller to the inner side from the top layer to the bottom layer. Therefore, even if, for example, light is incident from diagonally above the UV sensor chip 41, the light will not be reflected by the light-shielding metals 71-1 to 71-3 until the incidence angle exceeds a certain value $\theta 1$. Therefore, incidences of light reaching the interior of the circuit portion 60 due to being reflected between the layers of the light-shielding metals 71-1 to 71-3 may be prevented.

(2) New members, devices and the like for light-shielding are not required. Therefore, an increase in an area of formation in the UV sensor chip 41 may be suppressed and miniaturization is enabled.

(3) If, for example, plural via plugs 72 are provided in a staggered pattern as seen in a plan view of the fourth layer metal 73 illustrated in FIG. 2, light P from a transverse direction with respect to the circuit portion 60 may be light-shielded to a certain extent. Thus, the light-shielding effect of the light-shielding film portion 70 as a whole is further improved.

Second Exemplary Embodiment

Figure 4A:
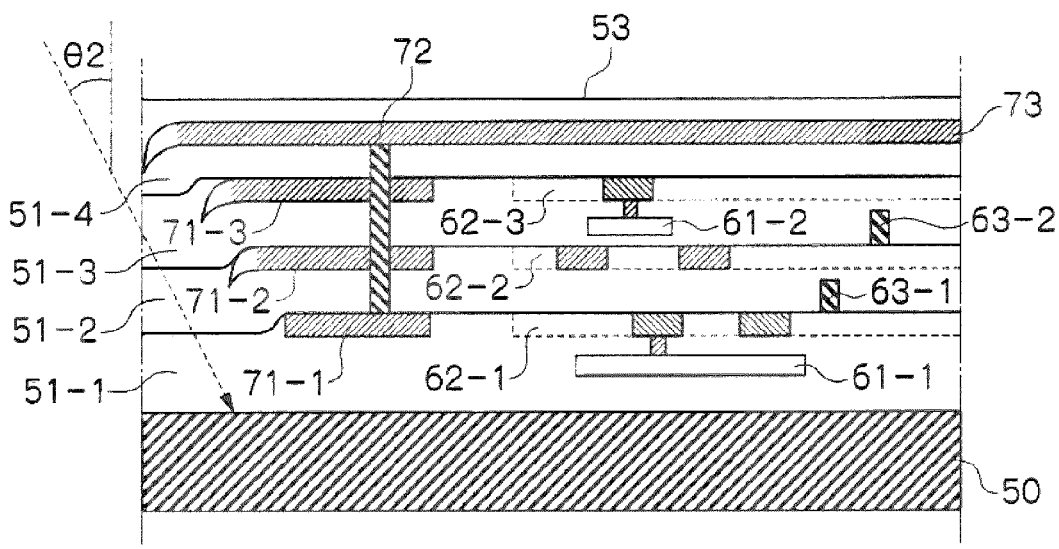
FIG. 4A and FIG. 4B are partial sectional views illustrating a UV sensor chip of a second exemplary embodiment of the present disclosure.
Figure 4B:
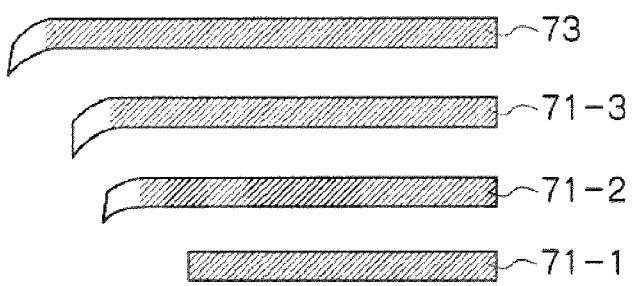

FIG. 4A and FIG. 4B are partial sectional views illustrating a UV sensor chip of a second exemplary embodiment of the present disclosure.

The UV sensor chip 41 of this second exemplary embodiment is characterized by outer edge portions of the light-shielding metals 71-2 to 71-3 and the fourth layer metal 73 being curved downward. Other structures of the UV sensor chip 41 are the same as in the first exemplary embodiment.

A fabrication method of the UV sensor chip 41 of this second exemplary embodiment is substantially the same as in FIG. 3A to FIG. 3E of the first exemplary embodiment.

In the step of FIG. 3C, the light-shielding metal 71-1 and the metal wiring layer 62-1 are covered over with the interlayer insulation film 51-2 and the surface of the interlayer insulation film 51-2 is made flat. However, because the light-shielding metal 71-1 and a wiring region of the metal wiring layer 62-1 are raised, a step is formed in spite of the flattening processing. If the light-shielding metal 71-2 is formed by the sputtering method or the like in this state, outer edge portions of the light-shielding metals 71-2 and 71-3 and the fourth layer metal 73 depend downward due to an effect of the step and stress at the time of formation of the passivation layer 53 in the step of FIG. 3E, and side faces of the light-shielding portion 70 are closed in. Because a portion below the light-shielding metal 71-1 is flat and has no step, the outer edge portion of the light-shielding metal 71-1 does not depend downward.

Effects of the Second Exemplary Embodiment

In addition to the effects of the first exemplary embodiment, there is the following effect.

(1) The outer edge portions of the light-shielding metals 71-2 to 71-3 and the fourth layer metal 73 are formed so as to depend downward and close in the side faces of the light-shielding film portion 70. Therefore, even if light P from diagonally above exceeds the incidence angle $\theta 1$, the light will not be reflected by the light-shielding metals 71-1 to 71-3 until the incidence angle exceeds a certain value $\theta 2$ (which is greater than $\theta 1$). Therefore, light-shielding is further improved compared to the first exemplary embodiment.

Third Exemplary Embodiment

Figure 5A:
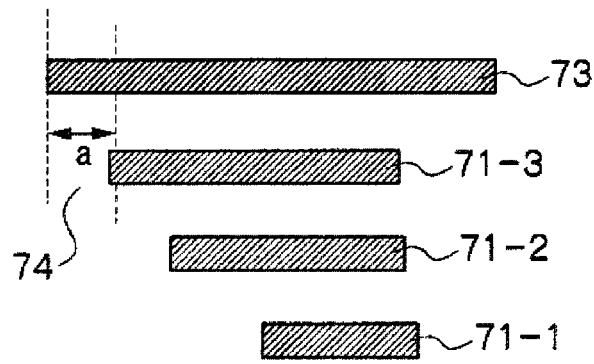
FIG. 5A and FIG. 5B are explanatory diagrams illustrating light-shielding metals and a fourth layer metal of a third exemplary embodiment of the present disclosure.
Figure 5B:
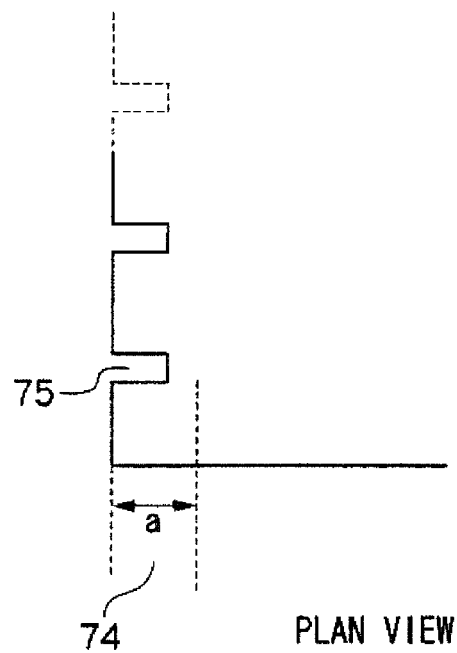
Figure 6A:
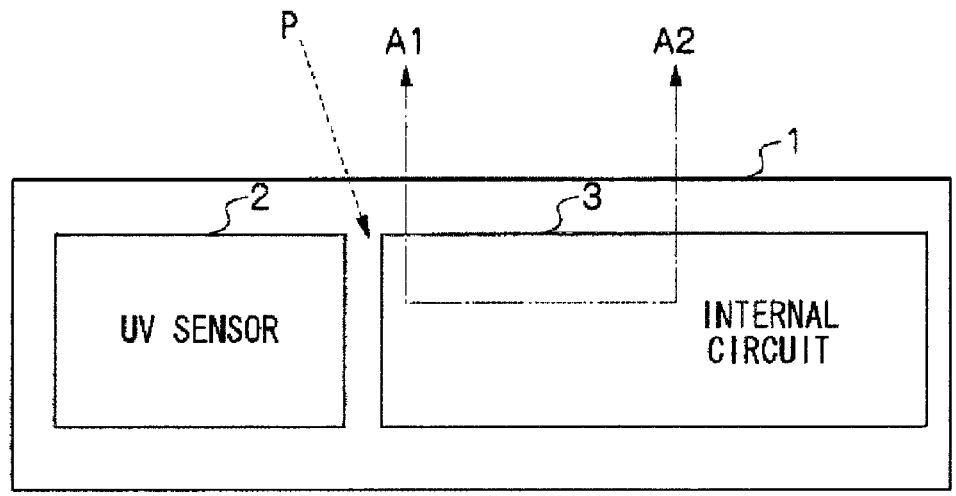
FIG. 6A and FIG. 6B are schematic structural diagrams illustrating a conventional UV sensor chip.
Figure 6B:
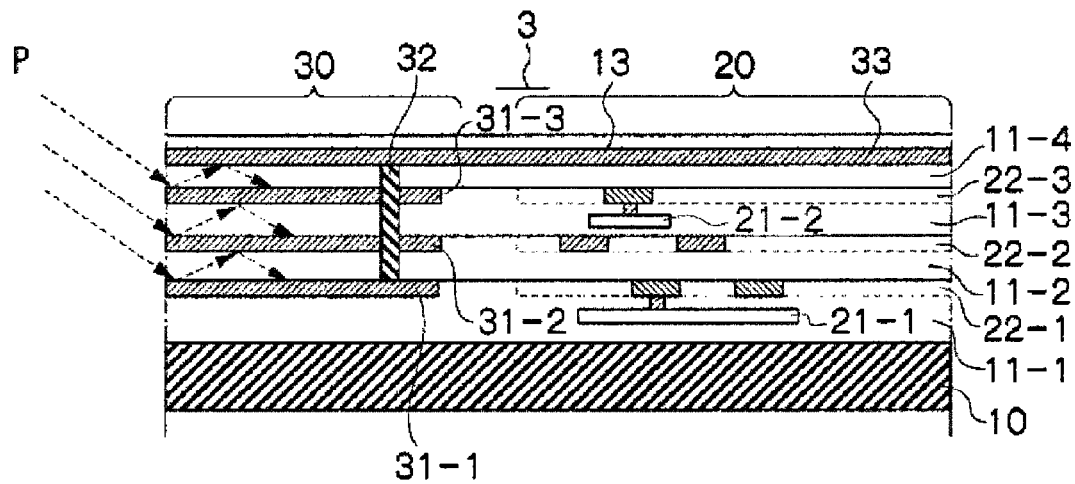
Figure 7:
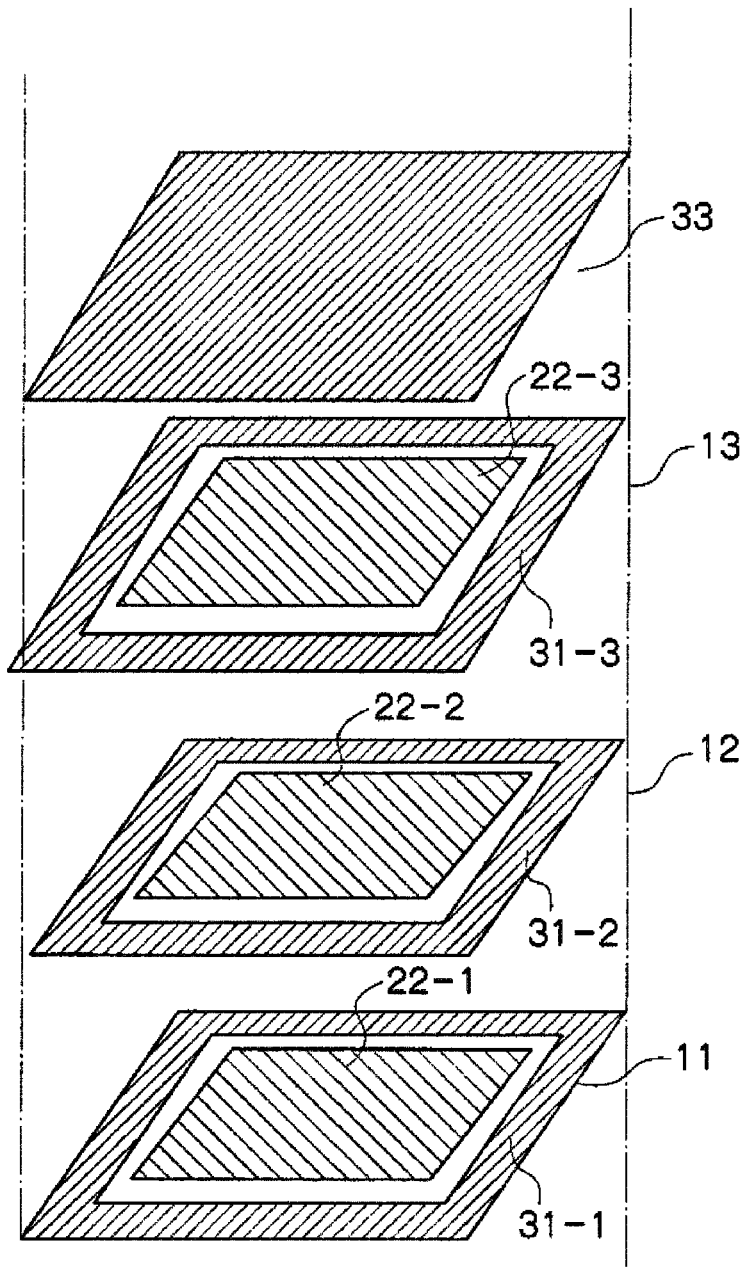
FIG. 7 is a schematic perspective view illustrating the circuit portion 20 and light-shielding film portion 30 of FIG. 6B.

FIG. 5A and FIG. 5B are explanatory diagrams illustrating the light-shielding metals 71-1 to 71-3 and the fourth layer metal 73 of the third exemplary embodiment of the present disclosure.

In this structure, slits 75 are indented into outer edge portions of projecting portions 74 of the light-shielding metals 71-2 and 71-3 and the fourth layer metal 73 of the UV sensor chip 41 of the second exemplary embodiment.

A fabrication method of the UV sensor chip 41 of this third exemplary embodiment is substantially the same as in FIG. 3A to FIG. 3E of the first exemplary embodiment.

However, in the fabrication steps of the first exemplary embodiment in FIG. 3D and FIG. 3E, when the light-shielding metals 71-2 and 71-3 and the fourth layer metal 73 are being formed by etching, at the same time, the slits are formed in the outer edge portions of the projecting portions 74.

In this third exemplary embodiment, in addition to the effects of the second exemplary embodiment, because the slits 75 are indented into the outer edge portions of the light-shielding metals 71-2 and 71-3 and the fourth layer metal 73, it is easier for the outer edge portions to depend downward. Therefore, the effect of closing in the circuit portion 60 is further improved.

Variant Examples

The present invention is not limited to the exemplary embodiments described above, and numerous modes of use and modifications are possible. These modes of use and modifications include, for example, the following (a) to (e).

(a) In FIG. 2, a case is described in which the shapes of the metal wiring layers 62-1 to 62-3 and the light-shielding metals 71-1 to 71-3 are rectangles, but shapes such as ellipses, polygons and the like are also possible.

(b) In FIG. 2, it is illustrated that the sizes of the metal wiring layers 62-1 to 62-3 and the light-shielding metals 71-1 to 71-3 get successively smaller at all edges of the rectangles from the top layer to the bottom layer. However, right edges (or left edges) of the metal wiring layers 62-1 to 62-3 and the light-shielding metals 71-1 to 71-3 may be fixed and distances from the right edges (or left edges) to left edges (or right edges) made successively smaller.

(c) In FIG. 2, it is illustrated that the sizes of the metal wiring layers 62-1 to 62-3 and the light-shielding metals 71-1 to 71-3 get successively smaller at all edges of the rectangles from the top layer to the bottom layer. However, just the sizes of the light-shielding metals 71-1 to 71-3 may be varied, without the sizes of the metal wiring layers 62-1 to 62-3 being varied.

(d) In FIG. 1B and FIG. 2, a case is described in which the metal wiring layers 62-1 to 62-3 and the light-shielding metals 71-1 to 71-3 are three layers. However, four or more layers are also possible.

(e) Materials and methods are exemplified in the description of the fabrication process of FIG. 3A to FIG. 3E but fabrication with other materials and methods is also possible.

Following from the above description, it should be apparent to those of ordinary skill in the art that, while the methods and apparatuses herein described constitute exemplary embodiments of the present disclosure and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the disclosure in order to fall within the scope of any claims, since the invention is defined by the claims and since inherent and/or unforeseen advantages of the present invention may exist even though they may not have been explicitly discussed herein.

What is claimed is:

1. A semiconductor device comprising:
    a circuit portion in which a plurality of wiring layers that include circuit elements are laminated;
    a first light-shielding film that covers an uppermost layer of the wiring layers and light-shields light that is illuminated at the circuit portion; and
    a plurality of second light-shielding films that are covered by the first light-shielding film and formed so as to respectively encircle the wiring layers in ring forms,
    wherein outer peripheries of the plurality of second light-shielding films are formed to be successively smaller from an upper layer to a lower layer, so that an outer periphery of each second light-shielding film is at an inner side relative to an outer periphery of a second light-shielding film disposed at an upper layer side thereof; and wherein outer edge portions of the first light-shielding film and the second light-shielding films are curved downward.

2. The semiconductor device according to claim 1, wherein slits are formed in the outer edge portions of the first light-shielding film and the second light-shielding films.

3. The semiconductor device according to claim 1, wherein the wiring layers are respectively insulated therebetween by insulation films.

4. The semiconductor device according to claim 1, further comprising a sensor portion that is formed in a vicinity of the circuit portion and receives the light.

5. The semiconductor device according to claim 1, wherein the first light-shielding film and the second light-shielding films are formed from metal.

6. The semiconductor device according to claim 4, wherein the sensor portion is an ultraviolet sensor that receives ultraviolet radiation, converts the ultraviolet radiation to electronic signals, and outputs the electronic signals to the circuit portion.

* * * * *